United States Patent [19]

Kim

[11] Patent Number: 5,162,249
[45] Date of Patent: Nov. 10, 1992

[54] METHOD OF MAKING SEMICONDUCTOR MEMORY DEVICE HAVING A DOUBLE STACKED CAPACITOR

[75] Inventor: Jae K. Kim, Kyungki-do, Rep. of Korea

[73] Assignee: Hyundai Electronics Industries Co., Ltd., Rep. of Korea

[21] Appl. No.: 726,863

[22] Filed: Jul. 8, 1991

Related U.S. Application Data

[62] Division of Ser. No. 503,228, Apr. 2, 1990, Pat. No. 5,059,548.

[30] Foreign Application Priority Data

Apr. 3, 1989 [KR] Rep. of Korea ............... 4351/89
Apr. 3, 1989 [KR] Rep. of Korea ............... 4352/89

[51] Int. Cl.$^5$ ............................. H01L 21/70
[52] U.S. Cl. ........................... 437/52; 437/47; 437/48; 437/60; 437/191; 437/233; 437/919
[58] Field of Search ............. 437/47, 48, 51, 52, 437/60, 69, 191, 195, 228, 233, 235, 919, 985; 357/23.6, 51

[56] References Cited

U.S. PATENT DOCUMENTS

| | | | |
|---|---|---|---|
| 4,855,801 | 8/1989 | Kuesters | 357/23.6 |
| 4,953,126 | 8/1990 | Ema | 357/23.6 |
| 4,977,102 | 12/1990 | Ema | 437/919 |
| 4,994,893 | 2/1991 | Ozaki et al. | 357/23.6 |
| 5,061,651 | 10/1991 | Ino | 437/919 |

FOREIGN PATENT DOCUMENTS 0295709 12/1988 European Pat. Off. ........... 357/23.6

*Primary Examiner*—Tom Thomas
*Attorney, Agent, or Firm*—Ladas & Parry

[57] ABSTRACT

A method for manufacturing a semiconductor memory device and the resulting device, wherein the MOSFET is electrically connected to the double stacked capacitor through a contact hole which comprises:

a dielectric film deposited on the sidewall of the contact hole with conductive spacers and conductive material layers to form a charge storage electrode of the double stacked capacitor in a first embodiment;

a dielectric film deposited on the sidewall of the contact hole with conductive material layers to form a charge storage electrode of the double stacked capacitor in a second embodiment;

a dielectric film deposited on the sidewall of the contact hole with conductive spacers and conductive material layers to form a second charge storage electrode of the double stacked capacitor in a third embodiment; and, a dielectric film deposited on the sidewall of the contact hole with conductive material layers to form a second charge storage electrode of the double stacked capacitor in a fourth embodiment.

5 Claims, 10 Drawing Sheets

Fig.2C
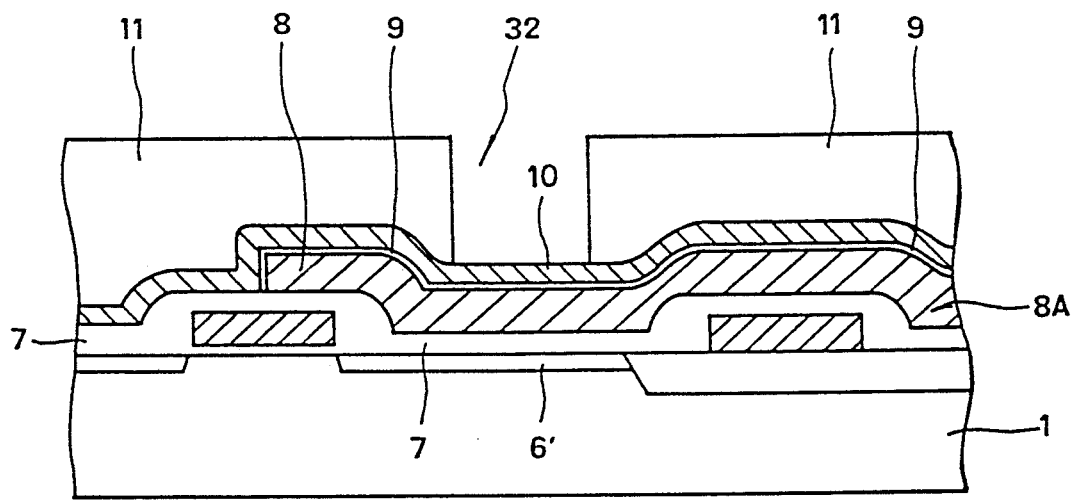
Fig.2D
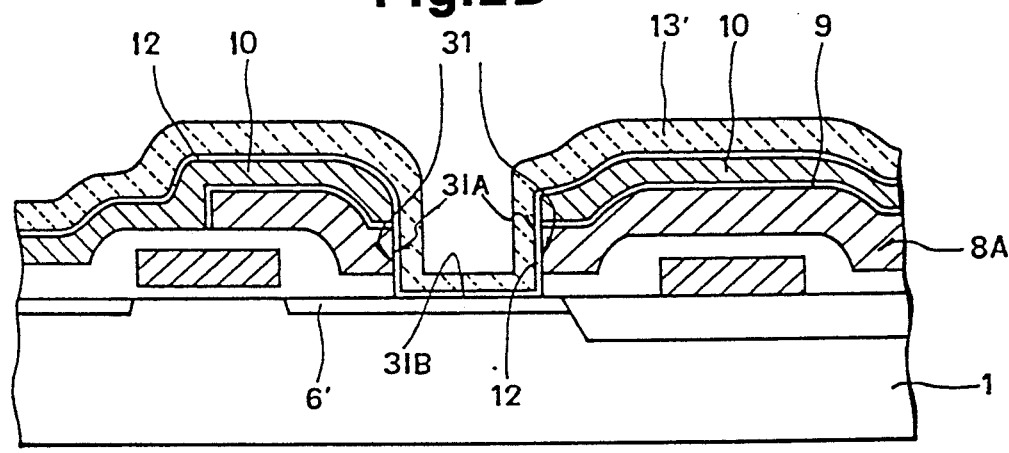
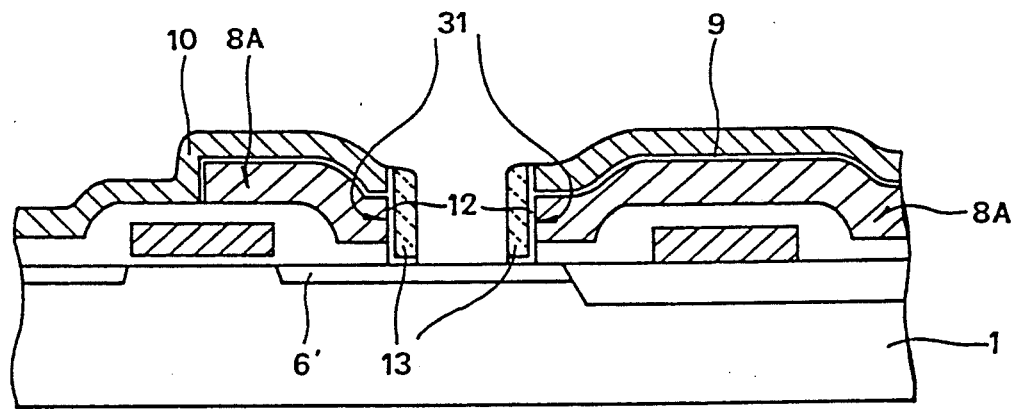
Fig.2E

Fig.3B
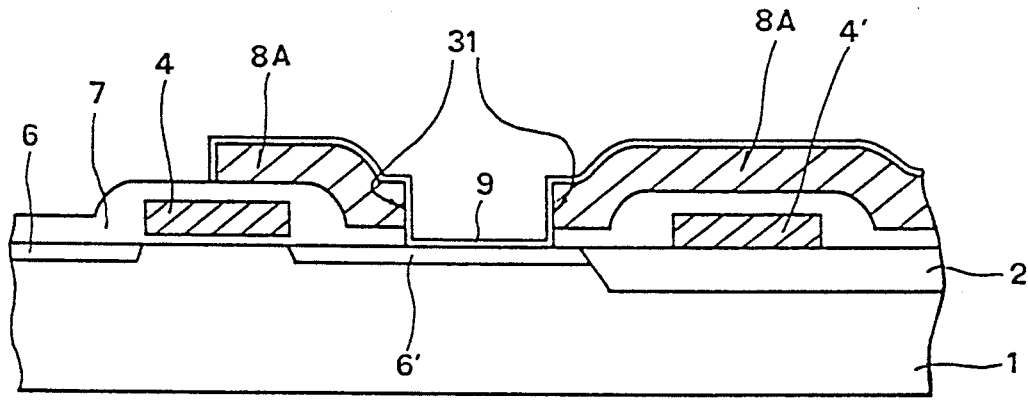
Fig.3C
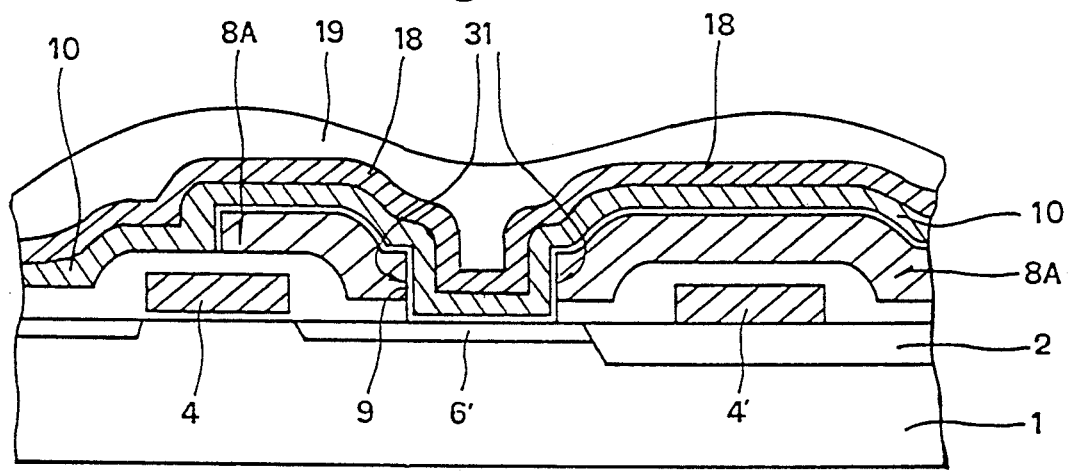
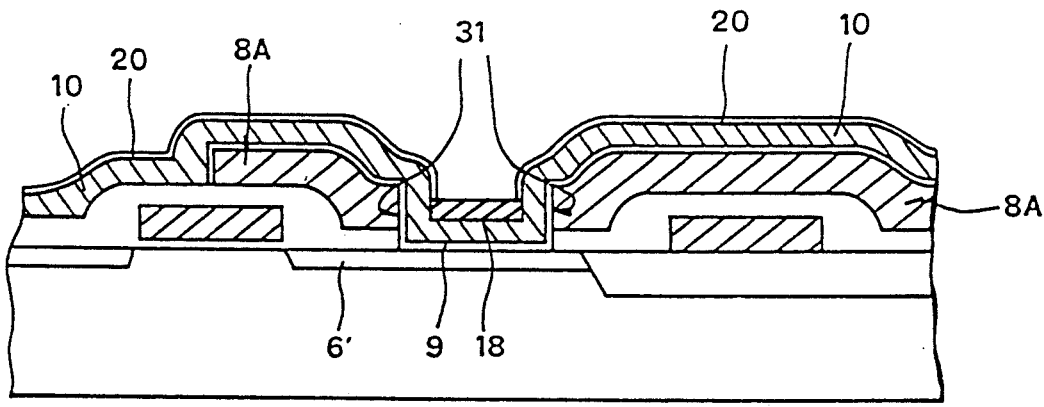
Fig.3D

Fig.3E
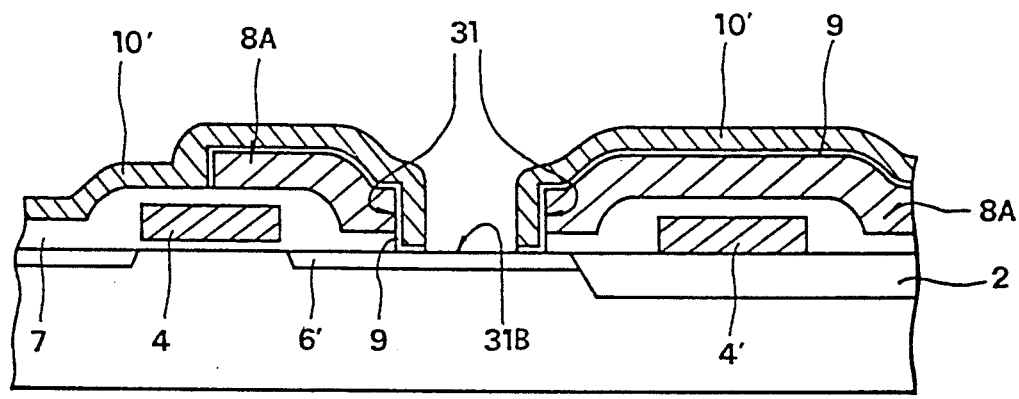
Fig.3F
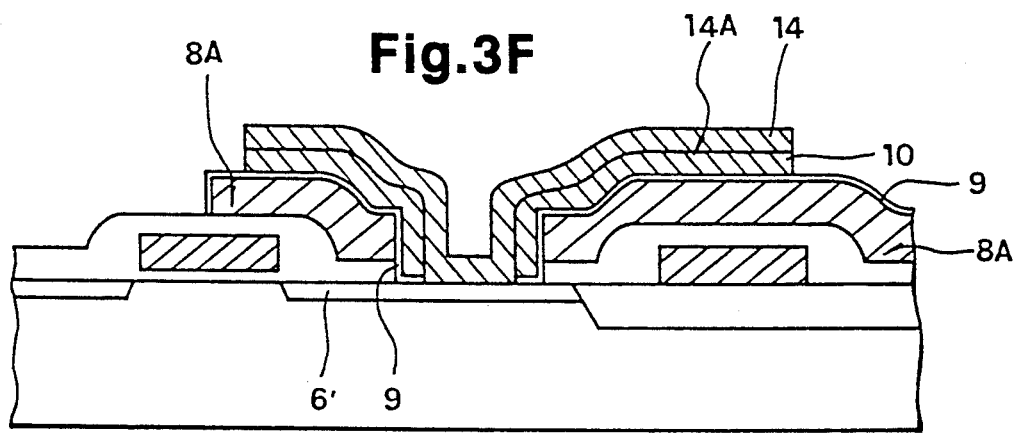
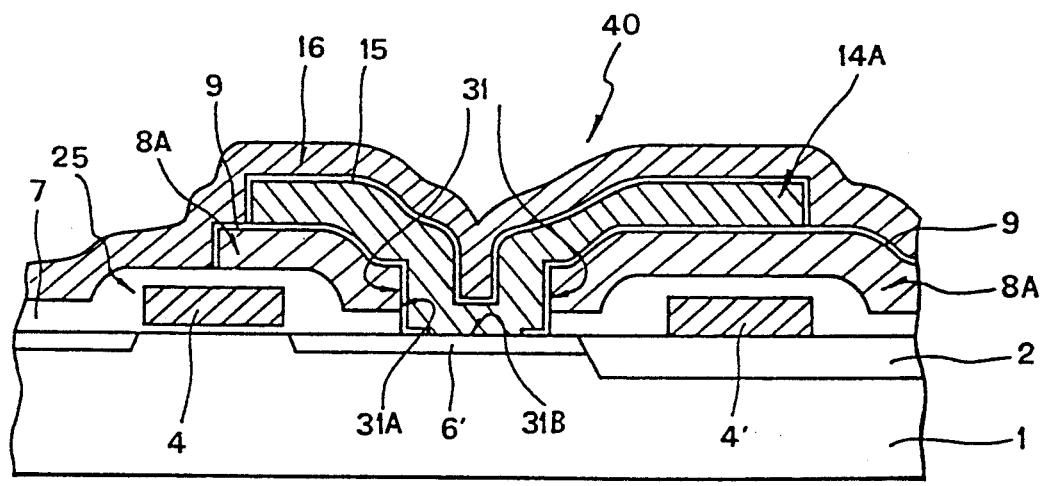
Fig.3G

METHOD OF MAKING SEMICONDUCTOR MEMORY DEVICE HAVING A DOUBLE STACKED CAPACITOR

This is a divisional of co-pending application Ser. No. 07/503,228 filed on Apr. 2, 1990 now U.S. Pat. No. 5,059,548.

BACKGROUND OF THE INVENTION

1. Field of Invention

This invention relates to a semiconductor memory device having a double stacked capacitor and a method for manufacturing the same, and more particularly to a semiconductor memory device having a double stacked capacitor the capacitance of which can be increased by forming a dielectric film on the wall of a contact hole of the capacitor when the contact hole is formed to electrically connect a plurality of electrodes to each other in the double stacked capacitor, and a method for manufacturing such memory device.

2. Information Disclosure Statement

So far, many kinds of dynamic random access memory (DRAM) devices had been developed, and as the integrity of the DRAM devices increases, such devices may be classified into a trench type device and a stacked type device depending upon the capacitor structure formed in the memory device.

In the case of the stacked type memory device, as the integrity of the memory devices increases, the area of unit cell of the memory device decreases. Thus, there is a limit to increasing the capacitance of capacitor in the memory device. In the prior art, attempts had been made to overcome such limitation. For example, one attempt formed a double stacked capacitor in which one plate electrode is positioned on the charge storage electrode and the other plate electrode is positioned under the charge storage electrode, that is, the charge storage electrode is sandwiched in between two plate electrodes.

Another attempt formed a different double stacked capacitor in which one charge storage electrodes is positioned on the plate electrode and the other charge storage electrode is positioned under the plate electrode, that is, the plate electrode is sandwiched in between charge storage electrodes.

In such approaches using the double stacked capacitor, when a contact grove is formed on a portion of the plate electrode on the drain region to connect the charge storage electrode and the drain region, or when a contact hole is formed on a portion of the plate electrode on the one charge storage electrode to connect *the one charge storage electrode and the other charge storage electrode, oxide film spacers are formed on the sidewall (the sidewall of the plate electrode) of contact hole, thereby protecting against a short circuit between the plate electrode and the charge storage electrode simultaneously with connecting electrodes.

However, since the oxide film spacers are formed on the sidewall of the contact hole, the oxide film spacers cannot function as the dielectrics of capacitor. Thus, the effective area of the capacitor is decreased as much as the area of the sidewall of the spacers.

Therefore, it is an object of the present invention to provide a semiconductor memory having a double stacked capacitor in which the effective area of the capacitor is increased by forming dielectric films instead of forming an insulating film spacers on the sidewall of a contact hole in the same double stacked capacitor as that of the prior art semiconductor memory device described above, and to provide a method for manufacturing such memory device.

According to the present invention, more capacitance which is proportional to the surface area of the dielectric formed on the contact hole can be obtained as compared to the prior art double stacked capacitor.

SUMMARY OF THE INVENTION

The present invention may be summarized as a method for manufacturing a semiconductor memory device and the resulting device, having a MOSFET and a double stacked capacitor in which the MOSFET comprises a gate electrode, a source region and a drain region formed on a silicon substrate, and an oxide film for insulation with the oxide film extending over the gate electrode, the top of the drain region and over the gate electrode line formed on the MOSFET, and the double stacked capacitor is electrically connected to the drain region of the MOSFET through a contact hole comprising insulating spacers deposited on the sidewall of the contact hole with conductive material layers to form a charge storage electrode of the double stacked capacitor, and wherein the improvement comprises electrically connecting the MOSFET to the double stacked capacitor through a contact hole which comprises:

a dielectric film deposited on the sidewall of the contact hole with conductive spacers and conductive material layers to form a charge storage electrode of the double stacked capacitor in a first embodiment;

a dielectric film deposited on the sidewall of the contact hole with conductive material layers to form a charge storage electrode of the double stacked capacitor in a second embodiment;

a dielectric film deposited on the sidewall of the contact hole with conductive spacers and conductive material layers to form a second charge storage electrode of the double stacked capacitor in a third embodiment; and, a dielectric film deposited on the sidewall of the contact hole with conductive material layers to form a second charge storage electrode of the double stacked capacitor in a fourth embodiment.

BRIEF DESCRIPTION OF THE DRAWINGS

For fuller understanding of the nature and objects of the invention, reference should be made to the following detailed description taken in conjunction with the accompanying drawing in which:

FIGS. 2A through 2G illustrate process steps for manufacturing a semiconductor memory device having a double stacked capacitor according to a first embodiment of the present invention;

FIGS. 3A through 3G illustrate process steps for manufacturing a semiconductor memory device according to a second embodiment of the present invention;

DETAILED DESCRIPTION

Figure 1:
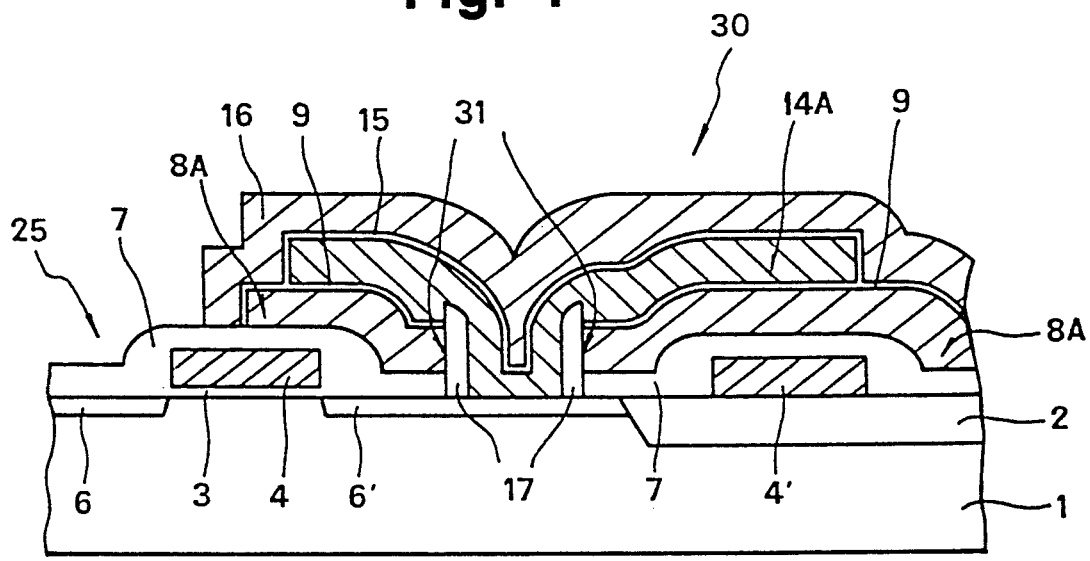
FIG. 1 illustrates a cross-section of a semiconductor memory device having a double stacked capacitor manufactured according to the prior art method.

FIG. 1 illustrates a cross-section of a prior art semiconductor memory device having a double stacked capacitor in which a charge storage electrode 14A is sandwiched between a first plate electrode 8A and a second plate electrode 16.

The process for forming such memory device and the structure thereof will be briefly described below.

An element separating oxide film 2 is formed on a portion of silicon substrate 1. A gate oxide film 3 and a gate electrode 4 are then sequentially formed on the silicon substrate 1 spaced from the element separating oxide film 2 simultaneously with forming gate electrode line 4' on the element separating oxide film 2. A source region 6 and a drain region 6' are formed into the silicon substrate 1, respectively, by ion implantation in the proximity of the left and right ends of the gate electrode 4. An oxide film 7 for insulating is deposited on the entire surface except for a portion of the surface of the drain region 6' forming a MOSFET 25. Then, a double a stacked capacitor 30 is formed which is electrically connected to the drain region 6' of the MOSFET 25. The double stacked capacitor 30 comprises a first plate electrode 8A on the oxide film 7 for insulation, a dielectric film 9, a charge storage electrode 14A, a dielectric film 15 and a second plate electrode 16 as illustrated in FIG. 1. A contact hole 31 having oxide film spacers 17 therein is formed on a portion of the drain region 6' by etching the oxide film 7, the plate electrode 8A and the dielectric film 9, thereby achieving an electrical connection between the plate electrode 8A of the double stacked capacitor 30 and the drain region 6' of the MOSFET 25.

However, the prior art memory device having such a structure has disadvantages as described above.

Therefore, the present invention provides a novel method for forming a semiconductor memory device having a double stacked capacitor in which a dielectric film is formed on the sidewall of a contact hole instead an insulating film spacer being formed thereat, thereby increasing an effective area of the double stacked capacitor.

The first embodiment of the present invention will be described in conjunction with FIG. 2A through 2G.

Figure 2A:
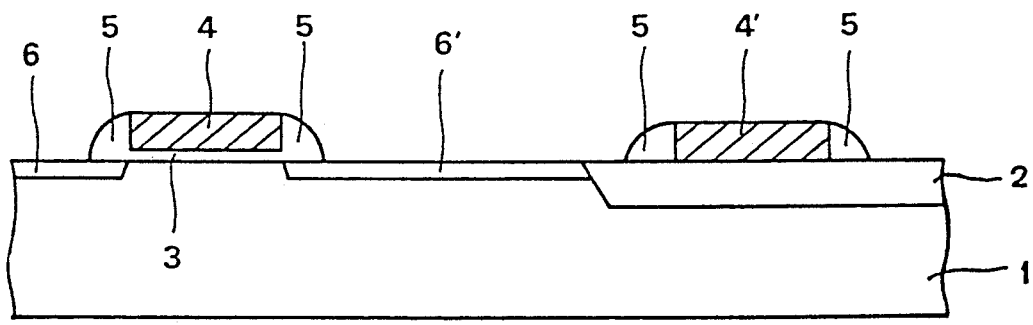

Referring FIG. 2A, an element separating oxide film 2 is formed on a portion of a silicon substrate 1. A gate oxide film 3, a gate electrode 4 and a gate electrode line 4' spaced from the gate electrode 4 are then formed as illustrated. After a source region 6 and a drain region 6' are formed in the silicon substrate 1 by ion implantation, oxide film spacers 5 are formed at the respective sides of the gate electrode 4 and the gate electrode line 4'.

Figure 2B:
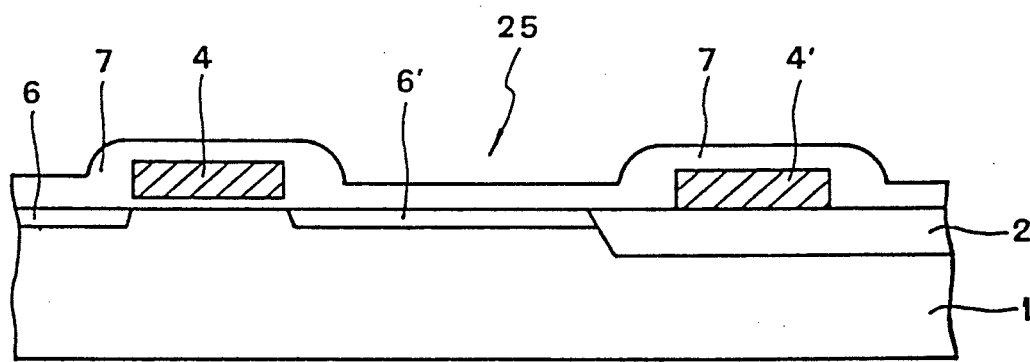

Referring to FIG. 2B, in order to insulate the gate electrode 4 from a first plate electrode 8A which will be formed above the gate electrode 4, an oxide film 7 for insulation is deposited to a predetermined thickness on the entire surface of the structure illustrated in FIG. 1, thereby forming a MOSFET 25.

Referring to FIG. 2C, a conductive material layer 8 for first plate electrode 8A is deposited on the oxide film 7 for insulation in the structure illustrated in FIG. 2B.

The first plate electrode 8A is formed on a portion of the oxide film 7 by a mask patterning process of the conductive material layer 8. A dielectric film 9 is formed on the first plate electrode 8A, and a conductive material layer 10 for charge storage electrode is deposited on the entire surface. In order to connect the conductive material layer 10 to the drain region 6', after a photoresistive layer 11 is deposited on the conductive material layer 10, a contact mask 32 is formed by removing a portion of the photoresistive layer 11 which is positioned over the drain region 6'.

Referring to FIG. 2D, the conductive material layer 10, the dielectric film 9, the first plate electrode 8A and the oxide film 7, which are positioned where a portion of the photoresistive layer 11 is removed, are etched sequentially, thereby forming a contact hole 31 having a sidewall 31A and a bottom 31B. After removing the entire the remaining photoresistive layer 11, a dielectric film 12 and a conductive material layer 13' for spacer are sequentially deposited. Herein, the conductive material layer 13' for spacer is deposited to protect the dielectric film 12 formed on the sidewall 31A of the contact hole 31.

Referring to FIG. 2E, a conductive spacers 13 are formed on the walls of the contact hole 31 by anisotropic etching of the conductive material layer 13', and the dielectric film 12, which is exposed on the drain region 6', is then etched away.

Figure 2F:
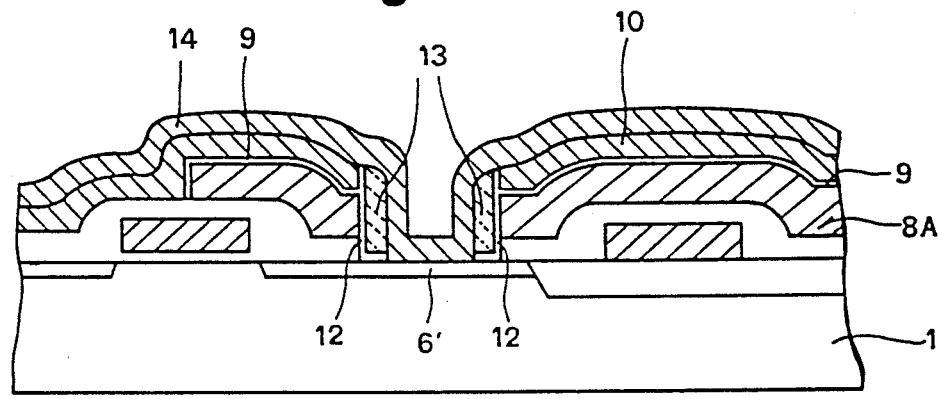

Referring to FIG. 2F, a conductive material layer 14 is deposited on the structure illustrated in FIG. 2E in order to electrically connect the respective conductive material layers 10 and 14 and conductive spacer 13 for charge storage electrode through the contact hole 31 to the drain region 6'.

Figure 2G:
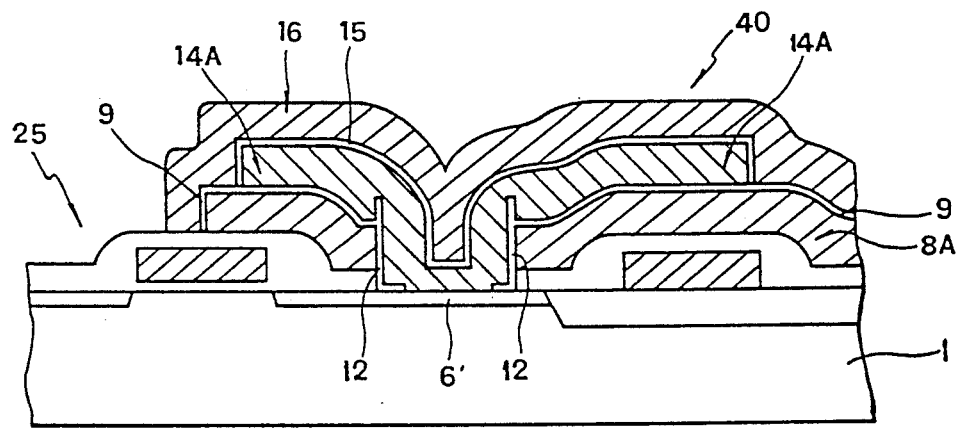

Referring to FIG. 2G, a charge storage electrode 14A is formed by a mask patterning process of the respective conductive material layers 10 and 14 for charge storage electrode. The charge storage electrode 14A comprises the patterned conductive material layers 10 and 14 together with conductive spacers 13 and electrically connects the charge storage electrode 14A to the drain region of the MOSFET through the contact hole. After a dielectric film 15 is formed on the charge storage electrode 14A, a second plate electrode 16 is deposited thereon, thereby forming a double stacked capacitor 40.

From the first embodiment of the present invention, it can be seen that the dielectric film 12 is formed on the sidewall 31A of the contact hole 31 and the conductive spacers 13 are formed thereon in order to protect the dielectric film 12, and the charge storage electrode 14A is then formed thereon, thereby achieving an electrical connection between the charge storage electrode 14A and the drain region 6' of the MOSFET 25 through the contact hole 31.

A second embodiment of the present invention will be described in conjunction with FIG. 3A through 3G hereinafter.

It should be noted that the resulting structure of a semiconductor memory device manufactured in accordance with the second embodiment of the present invention will be substantially the same as that of the semiconductor device manufactured in accordance with the first embodiment of the present invention, but the process steps for the second embodiment differs somewhat from the first embodiment.

Figure 3A:
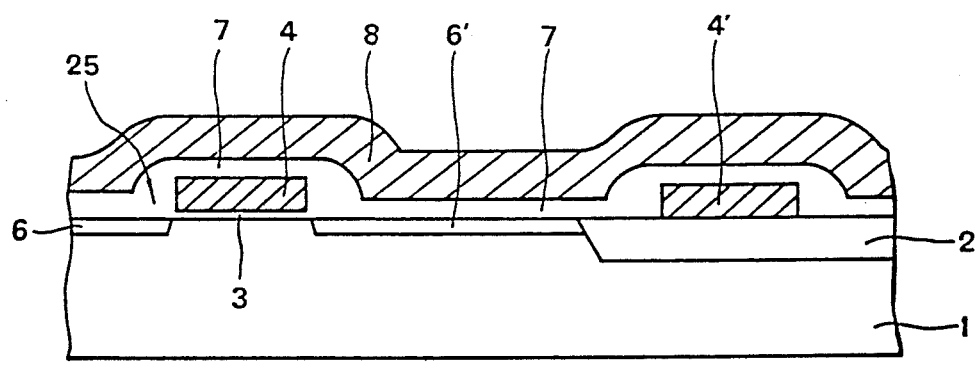

Referring to FIG. 3A, a conductive material layer 8 for plate electrode 8A is deposited to a predetermined thickness on the MOSFET 25 illustrated in FIG. 2B.

It should also be noted that since a basic structure illustrated in FIG. 3A utilizes the same structure as illustrated in FIG. 2B, a detailed description for forming such structure is omitted for sake of brevity.

Referring to FIG. 3B, a first plate electrode 8A is formed by the pattern process of the conductive material layer 8 on the oxide film 7 for insulating. A contact hole 31 is formed by removing a portion of the first plate electrode and a portion of the oxide film 7 for insulation on the drain region 6' in order to electrically connect a charge storage electrode 14A to be formed later to the drain region 6'. Then, a dielectric film 9 is deposited on a first plate electrode 8A and the exposed portion of the drain region 6'.

Referring to FIG. 3C, a conductive material layer 10 for charge storage electrode, a nitride film 18 and a photoresistive film 19, preferably made of Polyamide or SOG (Spin On Glass), are deposited in sequence on the structure illustrated in FIG. 3B. Herein, the photoresistive film 19 is deposited to leave a portion of the nitride film 18 only in the contact hole 31, as will be described hereinafter.

Referring to FIG. 3D, after the etch back process is performed with the same etching selectivity for the nitride film 18 and the photoresist film 19, in order to remove the nitride film 18 leaving only a portion thereof on a portion of the conductive material layer 10 for charge storage electrode which is positioned in the contact hole 31, an oxide film 20, referred to as a thermal oxide film 20 hereinafter, is grown thermally on the conductive material layer 10 for charge storage electrode.

Referring to FIG. 3E, the nitride film 18 on the conductive material layer 10 for charge storage electrode in the contact hole 31, FIG. 3D, is etched away utilizing the thermal oxide film 20 as a mask layer. Then, the conductive material layer 10 for charge storage electrode on the dielectric film 9 on the bottom 31B of the contact hole 31, which is exposed by the process for removing the nitride film 18, is etched away. The dielectric film 9 on the bottom 31B of the contact hole 31 and the thermal oxide film 20 are then etched utilizing the drain region 6' and the conductive material layer 10 for charge storage electrode, respectively, as an etching stop layer.

Referring to FIG. 3F, a conductive material layer 14 for charge storage electrode is deposited on the conductive material layer 10 for charge storage electrode and the drain region 6'. A charge storage electrode 14A is then formed by a mask patterning process of the respective conductive material layer 10 and 14 for charge storage electrode.

Referring to FIG. 3G, a dielectric film 15 is deposited on the second charge storage electrode 14A, thereby connecting it to the dielectric film 9. A second plate electrode 16 is then formed on the entire surface resulting in a double stacked capacitor 40.

As described above, in order to deposit the dielectric film 9 on the sidewall 31A of the contact hole 31, the second embodiment of the present invention utilizes an etch back process described in conjunction with FIG. 3D and. 3E with the same etching selectivity for the photoresistive film 19 and the nitride film 18, such etch back process leaves the nitride film 18 only on the bottom 31B of the contact hole 31.

Figure 4:
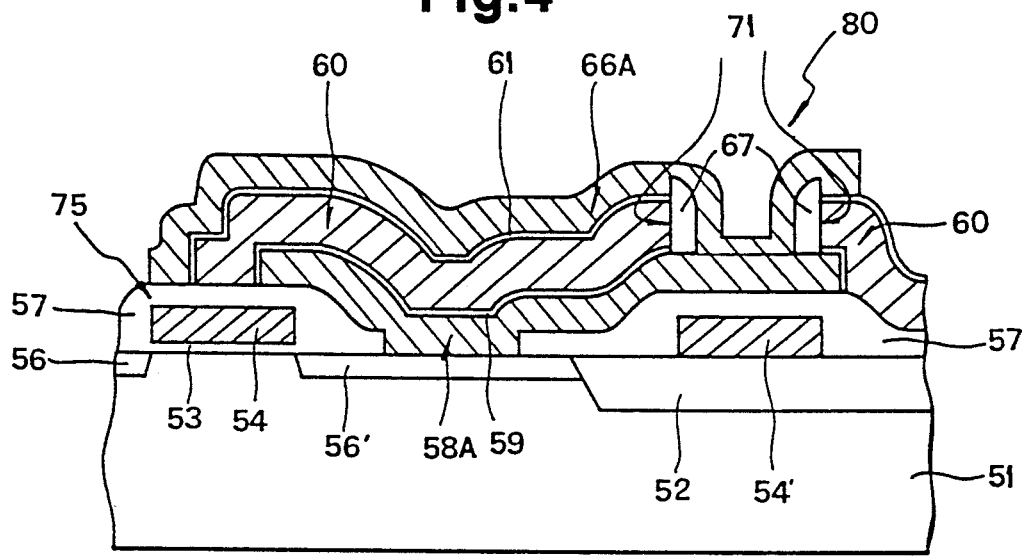
FIG. 4 illustrates a cross-section of another semiconductor memory device manufactured according to the prior art method.

FIG. 4 illustrates a cross section of another semiconductor memory device according to the prior art.

The memory device comprises a double stacked capacitor 80 having a first charge storage electrode 58A, a second charge electrode 66A with a plate electrode 60 embedded therebetween. An element separating oxide film 52 is formed on a portion of a silicon substrate 51. A gate oxide film 53, a gate electrode 54 and a gate electrode line 54' spaced from the gate electrode 54 are formed on the silicon substrate 51. A source region 56 and a drain region 56' are formed, by ion implantation, in the silicon substrate 51 in the proximity of both sides of the gate electrode 54. A oxide film 57 for insulation is deposited on the entire surface of the structure except for a portion of the top of the drain region 56', thereby forming a MOSFET 75.

A double stacked capacitor 80 is then formed which is electrically connected to the drain region 56'. The double stacked capacitor 80 comprises a first charge storage electrode 58A electrically connected to the drain region 56', a dielectric film 59, a plate electrode 60, a dielectric film 61 and a second charge storage electrode 66A, which are sequentially formed on the drain region 56'. A contact hole 71 having oxide film spacers 67 on the sidewall thereof is formed in a portion of the plate electrode 60 over the gate electrode line 54'. Thus, the second charge storage electrode 66A is electrically connected to the first charge storage electrode 58 through the contact hole 71, thereby achieving an electric connection between the second charge storage electrode 66A of the double stacked capacitor 80 and the drain region 56' of the MOSFET 75. The memory device described above comprises the oxide film spacers 67 formed on the sidewall of the contact hole 71 to insulate the plate electrode 60 from the second charge storage electrode 66A. The drain region 56' is connected to the second charge storage electrode 66A via the contact hole 71 through the first charge storage electrode 58. As a result of the structure described above, there is also a limitation to the increase of the capacitor in the memory device, since the effective area of the capacitor is decreased as much as the area of the sidewall of the spacers.

The third embodiment of the present invention will be described in conjunction with FIG. 5A through FIG. 5G, in which instead of forming the spacers 67 on the sidewall of the contact hole 71 in the memory device illustrated in FIG. 4, a dielectric film 64 is formed to increase the capacitance of the capacitor.

Figure 5A:
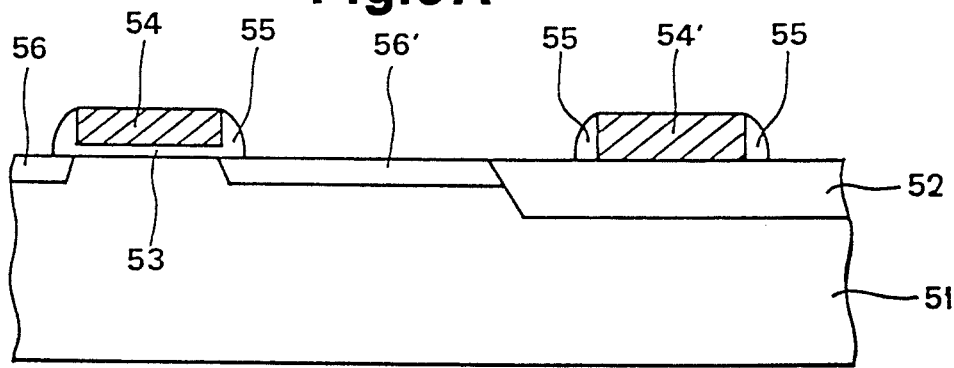
FIGS. 5A through 5G illustrate the process steps for manufacturing semiconductor memory device having a double stacked capacitor according to a third embodiment of the present invention.

FIG. 5A illustrates a cross section of a silicon substrate 51 comprising a element separating oxide film 52, a gate oxide film 53, gate electrode lines 54 and 54', oxide spacers 55, a source 54 and a drain region 56' formed thereon.

The element separating oxide film 52 is formed on a portion of the silicon substrate 51 and the gate oxide film 53 spaced the predetermined distance from the element separating oxide film 52 is also formed on a portion of the silicon substrate 51. The gate electrode 54 and the gate electrode line 54' are formed on the gate oxide film 52 and the element separating oxide film 52, respectively. The source region 56 and the drain region 56' are formed, by ion implantation, in the silicon substrate 51 in the proximity of both ends of the gate electrode 54, respectively. Then, the oxide film spacers 55 are formed at the respective sides of the gate electrode 54 and the gate electrode line 54'.

Figure 5B:
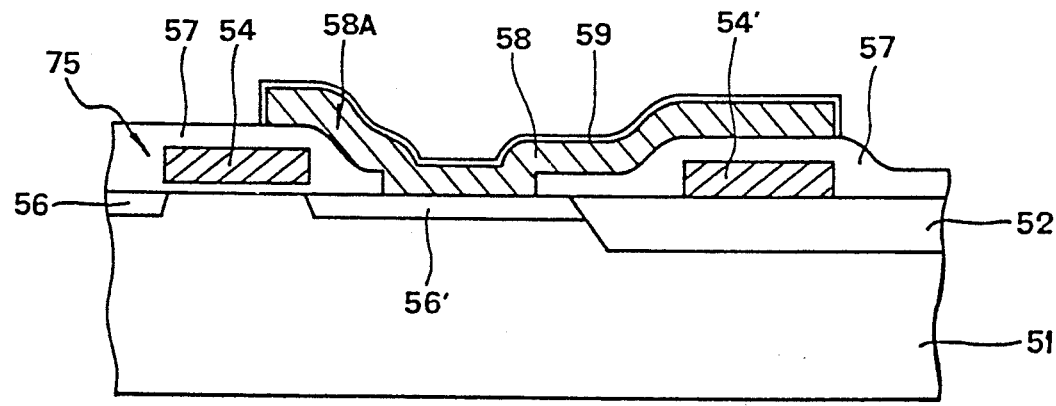

Referring to FIG. 5B, in order to insulate the gate electrode 54 and the gate electrode line 54' from a charge storage electrode 58 to be formed later, the predetermined thickness of an oxide film 57 for insulation is formed on the structure illustrated in FIG. 5A. A portion of the oxide film 57 for insulation on the drain region 56' is removed by the mask patterning process and a conductive material layer 58 for charge storage electrode is then deposited on the entire surface resulting in a MOSFET 75. The first charge storage electrode 58A is formed on the oxide film 57 for insulation and on the exposed drain region 56' by the mask patterning process of the conductive material 58 for charge storage electrode, thereby electrically connecting the drain region 56'. A dielectric film 59 is then formed on the first charge storage electrode 58A.

Figure 5C:
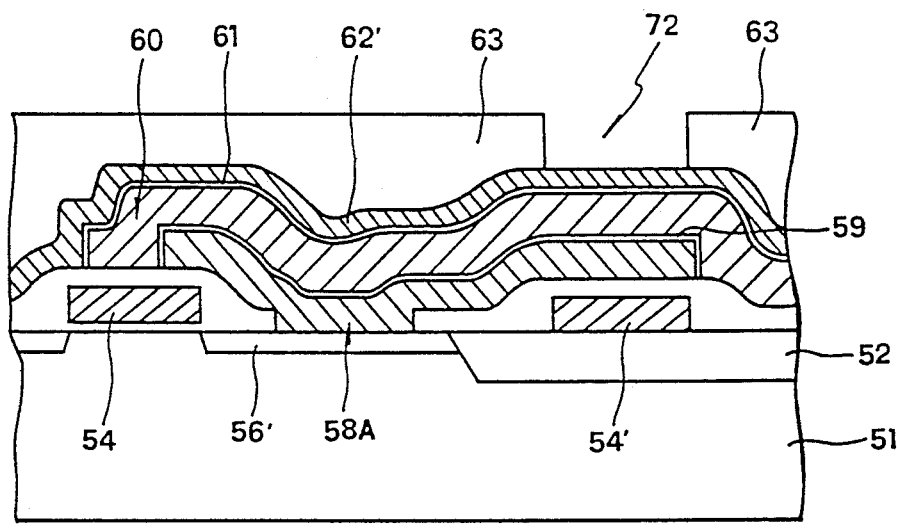

Referring to FIG. 5C, a plate electrode 60 is formed on the dielectric film 59. After a dielectric film 61 is formed on the plate electrode 60, a conductive material layer 62' for charge storage electrode is deposited thereon. In order to connect the conductive material layer 62' for charge storage electrode to the first charge storage electrode 58A, a photoresistive film 63 is deposited on the conductive material layer 62' for charge storage electrode A portion of the photoresistive film 63 on the conductive material layer 62' positioned over the first charge storage electrode 58A which in turn is positioned over the gate electrode line 54' is then removed, thereby forming a contact mask 72.

Figure 5D:
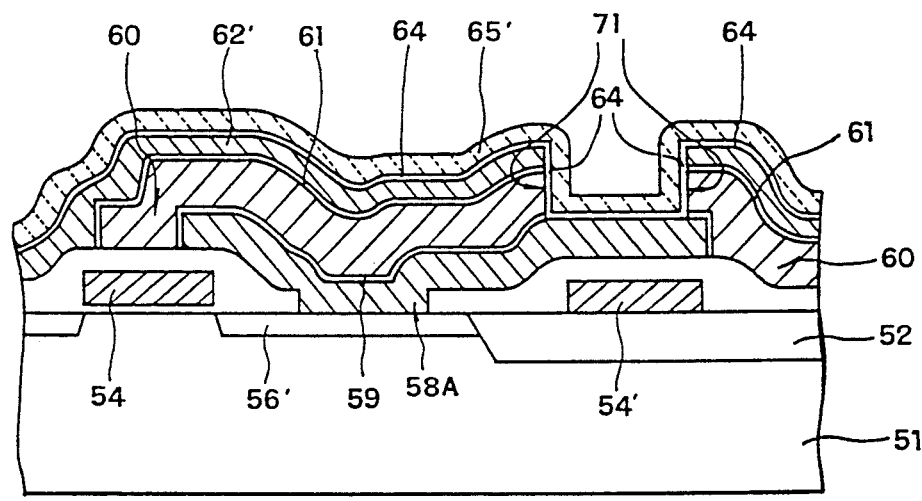

Referring to FIG. 5D, the respective portions of the conductive material layer 62' for charge storage electrode, the dielectric film 61, the plate electrode 60 and the dielectric film 59, which are positioned at the contact mask 72, are etched in sequence to form a contact hole 71 having sidewall 71A. The remaining photoresistive film 63 is then removed.

In order to form a dielectric film on the sidewall 71A of the contact hole 71, a dielectric film 64 is deposited on the conductive material layer 62' for charge storage electrode, and on the sidewall 71A of the contact hole 71. Then, a conductive material layer 65' for spacer is formed on the dielectric film 64.

Figure 5E:
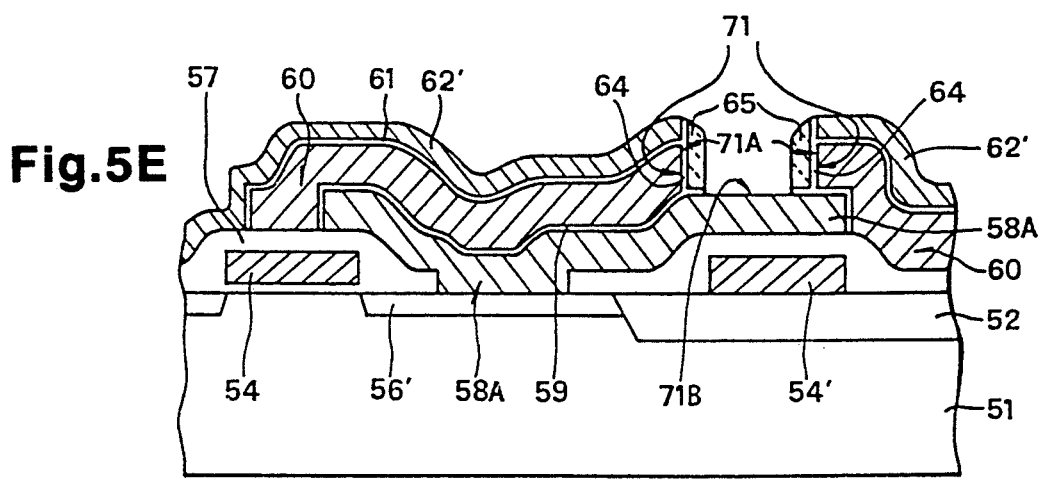

Referring to FIG. 5E, conductive spacers 65 are formed, by an anisotropic etching of the conductive material layer 65' for spacer, on the sidewalls 71A of the contact hole 71 on the structure illustrated in FIG. 5D. Thus, the dielectric film 64, which is formed on the sidewall 71A of the contact hole 71, can be protected by the spacers 65. The portion of the third dielectric film 64 on the conductive material layer 62' for charge storage electrode, and the portion thereof on bottom 71B of the contact hole 71 are then removed.

Figure 5F:
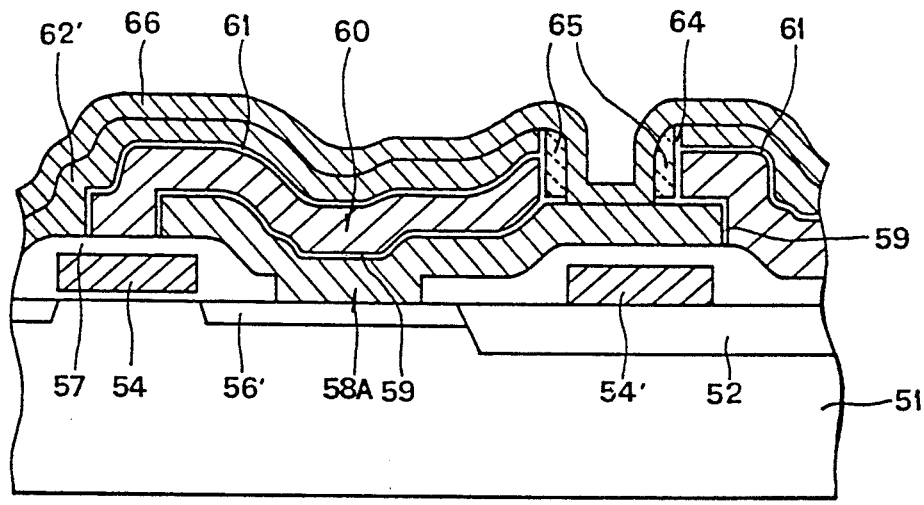

FIG. 5F illustrates a cross section of a structure in which in order to connect the conductive material layer 62' for charge storage electrode to the first charge storage electrode 58A, a conductive material layer 66 for charge storage electrode is deposited on the entire surface of the structure illustrated FIG. 5E.

Figure 5G:
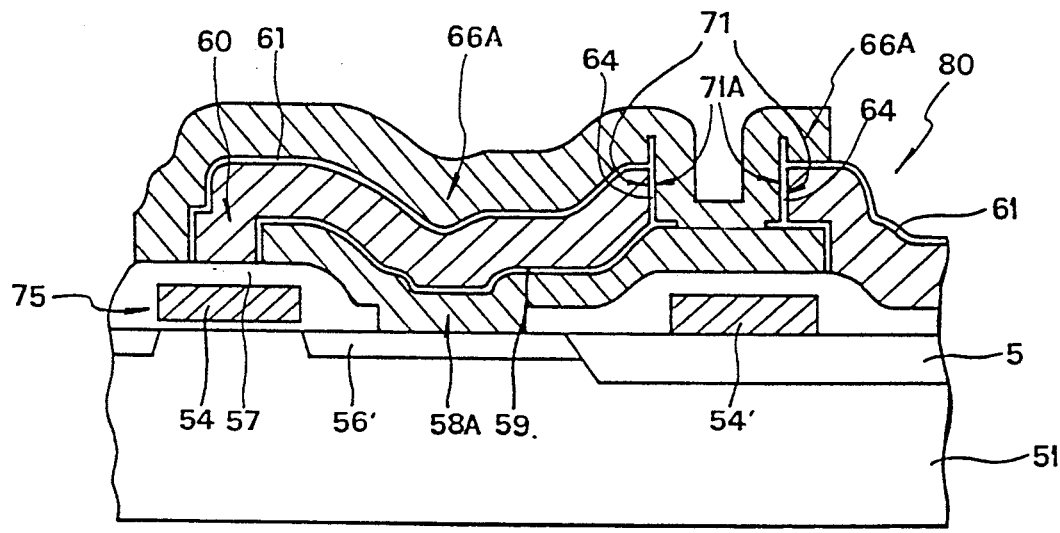

FIG. 5G illustrates a cross section of a structure in which a second charge storage electrode 66A is formed by a mask patterning process of the respective conductive material layers 62' and 66, thereby forming a double stacked capacitor 80.

As illustrated in drawings, the plate electrode 60 is sandwiched in between the first and second charge storage electrodes 58A and 66A, and the first and second charge storage electrodes 58A and 66A are electrically connected to each other through the contact hole 71. The dielectric film 64 is formed on the sidewalls 71A of the contact hole 71.

The fourth embodiment of the present invention will be described in conjunction with FIG. 6A through 6G.

Figure 6A:
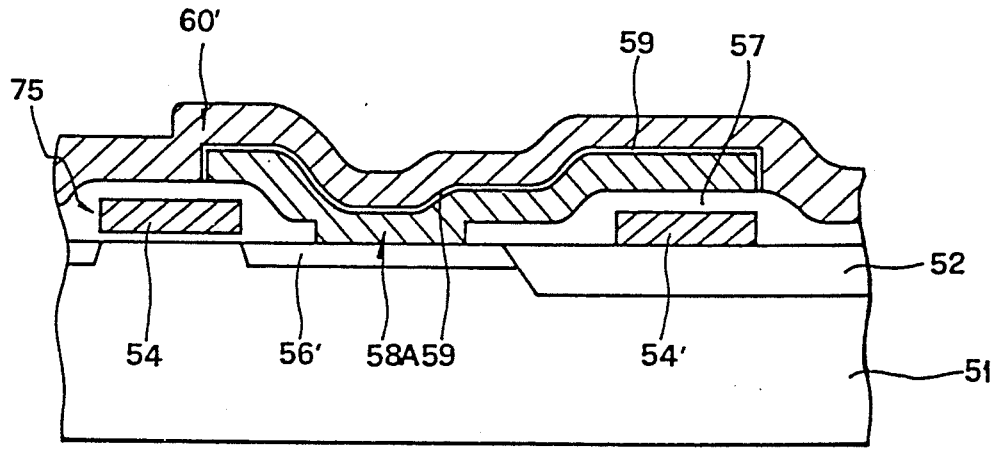
FIGS. 6A through 6G illustrates the process steps for manufacturing a semiconductor memory device having a double stacked capacitor according to a fourth embodiment of the present invention.

It should be noted that since the structure illustrated in FIG. 5B is utilized as a basic structure to form the structure illustrated FIG. 6A, the detailed description of the process for forming such structure illustrated in FIG. 5B, in which the first charge storage 58A is formed on the drain region 56' of the MOSFET 75, is omitted.

Figure 6B:
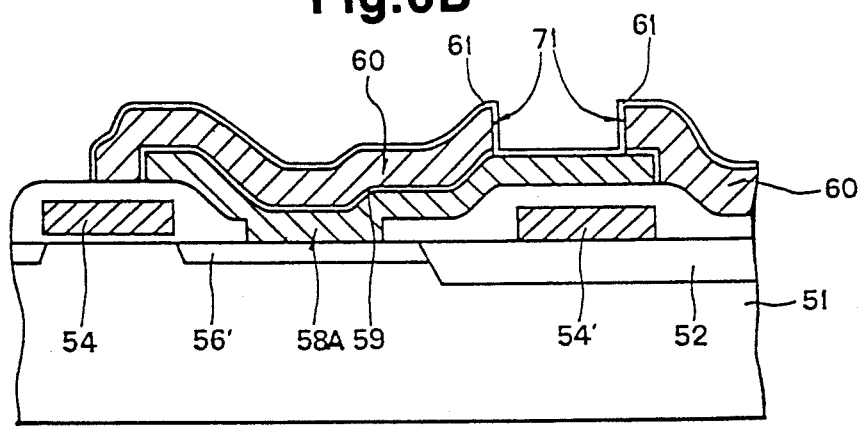

FIG. 6A illustrates a cross section of a structure in which a conductive material layer 60' for plate electrode is deposited on the dielectric film 59 of the structure illustrated in FIG. 5B. Referring to FIG. 6B, a plate electrode 60 is formed by a mask patterning process of the conductive material layer 60' for plate electrode. In order to connect the first charge storage electrode 58A to a second charge electrode 62 to be formed later, a portion of the plate electrode 60 and a portion of the dielectric film 59, each portion being positioned on the gate electrode line 54', are etched in sequence, thereby forming a contact hole 71. Then, a dielectric film 61 is deposited on the plate electrode 60 and on the sidewall of the contact hole 71.

Figure 6C:
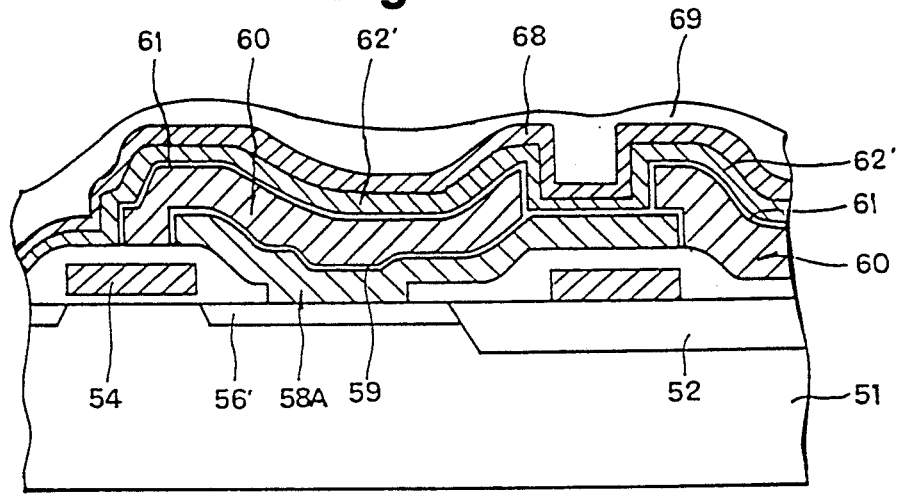

FIG. 6C illustrates a cross section of a structure in which a conductive material layer 62' for charge storage electrode, a nitride film 68 and a photoresistive film 69 made of, for example, Polyamide or SOG, are deposited in sequence on the dielectric film 61.

Figure 6D:
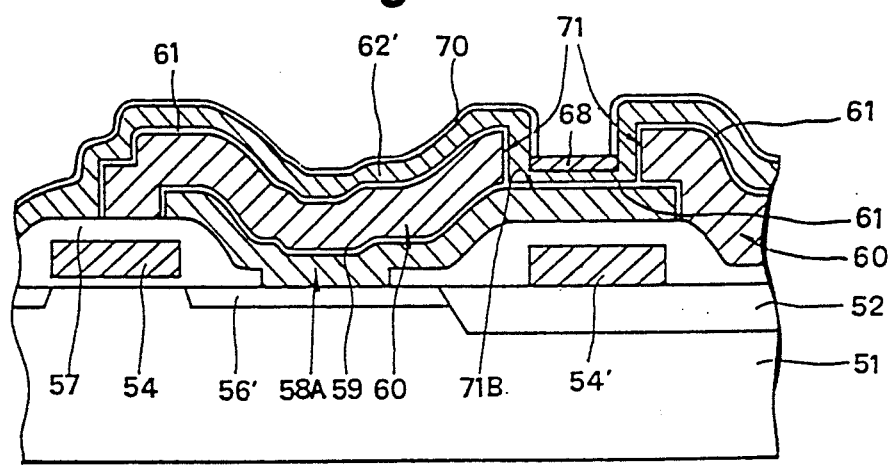

Referring to FIG. 6D, the photoresistive layer 69 and the nitride film 68 are removed by the etch back process with the same etching selectivity for the photoresistive film 69 and the nitride film 68, leaving only a portion of the nitride film 68 positioned on the conductive material layer 62' for charge storage electrode in the contact hole 71.

Then, a thermal oxide film 70 is grown on the conductive material 62' for charge storage electrode, which is exposed by the etch back process described above. At this time, when the thermal oxide film 70 is grown, the nitride film 68 on the bottom 71B of the contact hole 71 serves as a barrier layer so that the oxide film 70 cannot be grown at the bottom 71B of the contact hole 71.

Figure 6E:
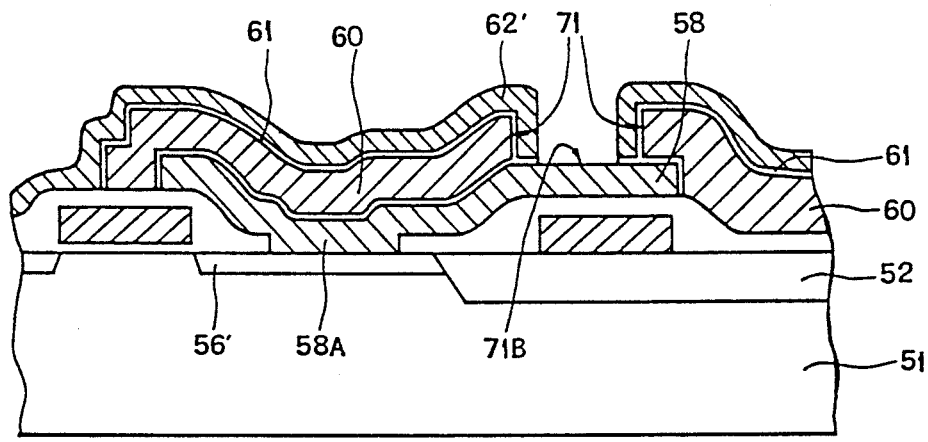

Referring to FIG. 6E, after a portion of the conductive material layer 62' for charge storage electrode and the nitride film 68, both in the contact hole 71 are removed sequentially, the thermal oxide film 70 and a portion of the dielectric film 61 at the bottom 71B of the contact hole 71 are removed. Here the thermal oxide film 70 serves as a etching barrier layer when the conductive material layer 62' for charge storage electrode and the nitride film 68 in the contact hole 71 is etched. The first charge storage electrode 58A and the conductive material layer 62' for charge storage electrode also function as etching stop layer when the thermal oxide film 70 and the dielectric film 61 is etched.

Figure 6F:
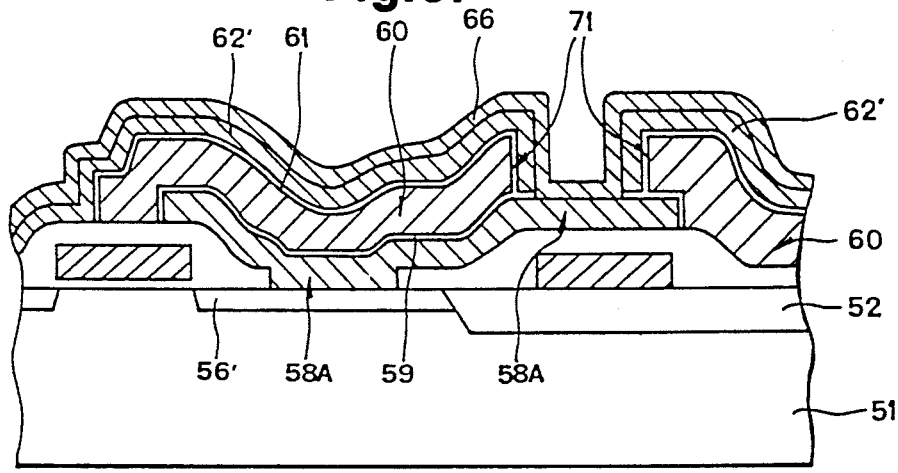

FIG. 6F illustrates a cross section of a structure in which in order to connect the conductive material layer 62' for charge storage electrode to the first charge storage electrode 58A, a conductive material layer 66 for charge storage electrode is deposited on the entire surface, that is, on the conductive material layer 62' for charge storage electrode and on the conductive material layer 66 for charge storage electrode exposed in the contact hole 71.

Figure 6G:
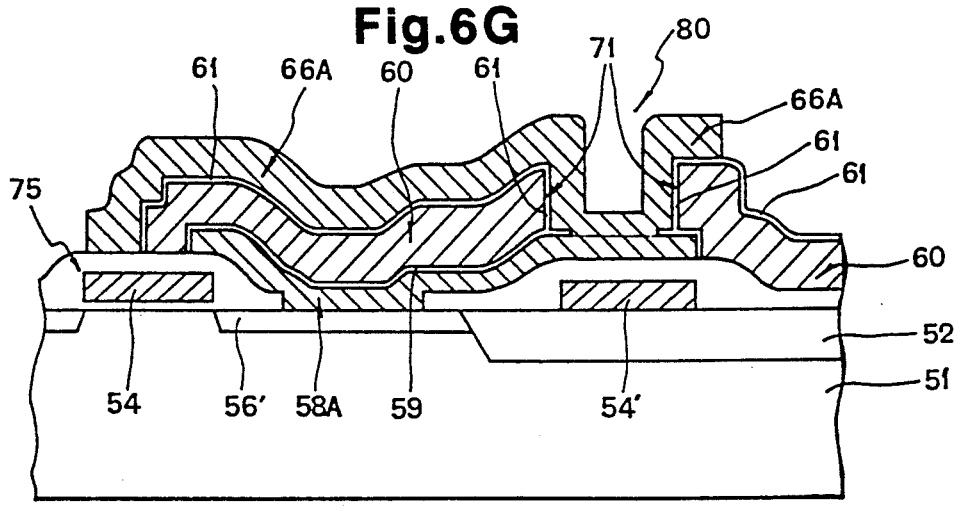

FIG. 6G illustrates a cross section of a structure in which a second charge storage electrode 66A is formed by a mask patterning process of the respective conductive material layer 62' and 66 for charge storage electrode, thereby connecting the second charge storage electrode 66A through the contact hole 71 to the first charge storage electrode 58A which is electrically connected to the drain region 56' of the MOSFET 75. Thus, a semiconductor memory device having a double stacked capacitor 80, which is electrically connected to the MOSFET 75, is obtained.

It should be noted that even though the structure of the double stacked capacitor of the memory device of the fourth embodiment is substantially the same as that of the third embodiment, there are differences between the methods for forming the dielectric film on the sidewall of the contact hole when the first and second charge storage electrodes 58A and 66A are connected to each other through the plate electrode 60.

Also, even though it was not described herein in detail, after the processes for forming the structures illustrated in FIG. 5G and 6G, an insulating layer is deposited on the entire surface and a bit line is then connected to the source region 6, thereby forming a dynamic random access memory.

As can be seen from the detailed description described in conjunction with the preferred embodiments, when the double stacked capacitor is formed, instead of forming spacers, the dielectric film can be formed on the sidewall of the contact hole which is formed to electrically connect the respective electrodes of the device, thereby increasing the capacitance of the double stacked capacitor in the same area memory.

The foregoing description of the preferred embodiments has been presented for purpose of illustration and description. It is not intended to limit the scope of this invention. Many modifications and variations are possible in the light of above teaching. It is intended that the scope of the invention be defined by the claims.

What is claimed is:

1. A method for manufacturing a semiconductor memory device having a MOSFET and a double stacked capacitor in which the MOSFET comprises a gate electrode 54, a source region 56 and a drain region 56' formed on a silicon substrate, and an oxide film 57 for insulation with the oxide film extending over the gate electrode, the top of the drain region and over the gate electrode line formed on the MOSFET, and the double stacked capacitor is electrically connected to the drain region 56' of the MOSFET, wherein the improvement for forming the double stacked capacitor to electrically connect the MOSFET comprises:

removing a portion of the oxide film for insulation on the drain region;
 depositing a conductive material layer 58 on the entire surface of the structure and etching the conductive material layer 58 to form a first charge storage electrode 58A;
 forming a dielectric film 59 on the first charge storage electrode 58A;
 forming a plate electrode 60 on the dielectric film 59;
 forming a contact hole having a sidewall 71A and a bottom 71B by sequentially etching, a portion of each of the plate electrode 60 and the dielectric film 59 to expose the first charge storage electrode 58A;
 forming a dielectric film 61 on the plate electrode 60 and on the sidewall and bottom of the contact hole;
 forming a conductive material layer 62' on the entire surface of the structure;
 forming a nitride film on the conductive material layer 62';
 removing the nitride film by an etch back process, leaving only a portion of the nitride film on that portion of the conductive material layer 62' which is positioned on the bottom of the contact hole;
 growing a thermal oxide film on the conductive material layer 62';
 etching the nitride film remaining in the contact hole utilizing the thermal oxide film as a mask layer;
 etching the conductive material layer 62' from the bottom of the contact hole to expose the dielectric film 61;
 removing the thermal oxide film and the dielectric film 61 exposed at the bottom of the contact hole;
 depositing a conductive material layer 66 on the entire surface; and,
 performing a mask patterning process of respective conductive material layer 62' and 66 thereby forming a charge storage electrode 66A comprising the patterned conductive material layer 62' and 66 to electrically connect the second charge storage electrode 66A, through the contact hole, via the first charge storage electrode 58A to the drain region of the MOSFET.

2. The method of claim 1 wherein the etch back process for removing the nitride film comprises the steps of:
 depositing a photoresistive layer on the nitride film; and,
 etching the nitride film and the photoresistive layer with an etching selectivity for the nitride film and the photoresistive layer to retain only a portion of the nitride film on the conductive material layer 62' which is positioned on the bottom of the contact hole.

3. A method for manufacturing a semiconductor memory device having a MOSFET and a double stacked capacitor in which the MOSFET comprises a gate electrode, a source region and a drain region formed on a silicon substrate, and an oxide film for insulation with the oxide film extending over the gate electrode, the top of the drain region and over the gate electrode line formed on the MOSFET, and the double stacked capacitor is electrically connected to the drain region of the MOSFET, wherein the improvement for electrically connecting the double stacked capacitor to the MOSFET by utilizing a nitride film comprises:

removing a portion of the oxide film for insulation on the drain region;
 depositing a conductive material layer on the entire surface of the structure and etching the conductive material layer to form a first charge storage electrode;
 forming a dielectric film on the first charge storage electrode;
 forming a plate electrode on the dielectric film;
 forming a contact hole having a sidewall and a bottom by sequentially etching, a portion of each of the plate electrode and the dielectric film to expose the first charge storage electrode;
 forming a dielectric film on the plate electrode and on the sidewall and bottom of the contact hole;
 forming a conductive material layer on the entire surface of the structure;
 forming a nitride film on the conductive material layer;

removing the nitride film by an etch back process, leaving only a portion of the nitride film on that portion of the conductive material layer which is positioned on the bottom of the conductive hole;

growing a thermal oxide film on the conductive material layer;

etching the nitride film remaining in the contact hole utilizing the thermal oxide film as a mask layer;

etching the conductive material layer from the bottom of the contact hole to expose the dielectric film;

removing the thermal oxide film and the dielectric film exposed at the bottom of the contact hole;

depositing a conductive material layer on the entire surface; and, performing a mask patterning process of the respective conductive material layers thereby forming a charge storage electrode comprising the patterned conductive material layers to electrically connect the second charge storage electrode, through the contact hole, via the first charge storage electrode to the drain region of the MOSFET.

4. The method of claim 3 wherein the etch back process for removing the nitride film comprises the steps of:

depositing a photoresistive layer on the nitride film; and, etching the nitride film and the photoresistive layer with an etching selectivity for the nitride film and the photoresistive layer to retain only a portion of the nitride film on the conductive material layer which is positioned on the bottom of the contact hole.

5. A method for manufacturing a semiconductor memory device having a MOSFET and a double stacked capacitor in which the MOSFET comprises a gate electrode, a source region and a drain region formed on a silicon substrate, and an oxide film for insulation with the oxide film extending over the gate electrode, the top of the drain region and over the gate electrode line formed on the MOSFET, wherein the improvement for electrically connecting the double stacked capacitor to the MOSFET by utilizing a nitride film comprises:

removing a portion of the oxide film for insulation on the drain region;

depositing a conductive material layer on the entire surface of the structure and etching the conductive material layer to form a first charge storage electrode;

forming a dielectric film on the first charge storage electrode;

forming a plate electrode on the dielectric film; forming a contact hole having a sidewall and a bottom by sequentially etching, a portion of each of the plate electrode and the dielectric film to expose the first charge storage electrode;

forming a dielectric film on the plate electrode and on the sidewall and the bottom of the contact hole;

forming a conductive material layer on the entire surface of the structure;

forming a nitride film on the conductive material layer;

removing the nitride film by depositing a photoresistive layer on the nitride film and by etching the nitride film and the photoresistive layer with an etching selectivity for the nitride film and the photoresistive layer to retain only a portion of the nitride film on the conductive material layer which is positioned on the bottom of the contact hole;

growing a thermal oxide film on the conductive material layer;

etching the nitride film remaining in the contact hole utilizing the thermal oxide film as a mask layer;

etching the conductive material layer from the bottom of the contact hole to expose the dielectric film;

removing the thermal oxide film and the dielectric film exposed at the bottom of the contact hole;

depositing a conductive material layer on the entire surface; and, performing mask patterning process of the respective conductive material layers thereby forming a charge storage electrode comprising the patterned conductive material layers to electrically connect the second charge storage electrode, through the contact hole, via the first charge storage electrode to the drain region of the MOSFET.

* * * * *